(12) United States Patent
Li et al.

(10) Patent No.: US 10,008,491 B1
(45) Date of Patent: Jun. 26, 2018

(54) LOW CAPACITANCE ELECTROSTATIC DISCHARGE (ESD) DEVICES

(71) Applicant: GLOBALFOUNDRIES INC., Grand Cayman (KY)

(72) Inventors: You Li, Burlington, VT (US); Robert J. Gauthier, Jr., Hinesburg, VT (US); Souvick Mitra, Essex Junction, VT (US); Mickey Yu, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/655,274

(22) Filed: Jul. 20, 2017

(51) Int. Cl.
*H01L 27/02* (2006.01)
*H01L 29/861* (2006.01)
*H01L 23/66* (2006.01)

(52) U.S. Cl.
CPC .......... *H01L 27/0262* (2013.01); *H01L 23/66* (2013.01); *H01L 27/0255* (2013.01); *H01L 29/861* (2013.01)

(58) Field of Classification Search
CPC .............. H01L 27/0262; H01L 27/1207
See application file for complete search history.

(56) References Cited

U.S. PATENT DOCUMENTS

| | | |
|---|---|---|
| 5,340,759 A | 8/1994 | Hsieh et al. |
| 6,610,262 B1 | 8/2003 | Peng et al. |
| 6,690,557 B2 | 2/2004 | Hung et al. |
| 7,885,046 B1 | 2/2011 | Gallerano et al. |
| 8,614,121 B2 | 12/2013 | Gauthier, Jr. et al. |
| 8,686,510 B2 | 4/2014 | Gossner et al. |
| 8,835,977 B2 | 9/2014 | Bobde et al. |
| 9,012,955 B2 * | 4/2015 | Fonteneau ............ H01L 29/749 257/133 |
| 9,165,943 B2 | 10/2015 | Fenouillet-Beranger et al. |
| 2004/0004231 A1 | 1/2004 | Peng et al. |
| 2015/0270393 A1 | 9/2015 | Kumar |

FOREIGN PATENT DOCUMENTS

| | | |
|---|---|---|
| EP | 2685500 | 1/2014 |
| WO | 2006001990 | 1/2006 |

* cited by examiner

*Primary Examiner* — Mark Prenty
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to low capacitance electrostatic discharge (ESD) devices and methods of manufacture. The structure includes: a first structure comprising a pattern of a first diffusion region, a second diffusion region and a third diffusion region partly extending over a first well; and a second structure comprising a fourth diffusion region in a second well electrically connecting to the first structure to form a silicon controlled rectifier (SCR) on a bulk region of a substrate.

20 Claims, 3 Drawing Sheets

| Case | DOEs | C_total |
|---|---|---|
| 1 | C1=C, C2=C, C3=2C | 0.75C |
| 2 | C1=0.5C, C2=C, C3=2C | 0.43C |

…

LOW CAPACITANCE ELECTROSTATIC DISCHARGE (ESD) DEVICES

FIELD OF THE INVENTION

The present disclosure relates to semiconductor structures and, more particularly, to low capacitance electrostatic discharge (ESD) devices and methods of manufacture.

BACKGROUND

High frequency circuit applications (e.g., ASIC high speed serial (HSS) links, power amplifiers in wireless communications, etc.) require low-capacitance electrostatic discharge (ESD) protection. For example, a power amplifier in CMOS technologies is susceptible to ESD events, which can damage the integrated circuit (IC), hence requiring ESD protection.

Conventional ESD devices using, e.g., ESD diodes, ESD NFETs, etc., tend to have a high parasitic capacitance which impacts circuitry when the ESD is off, during normal operation. Silicon-Controlled-Rectifier (SCR) structures are a desired alternative ESD structure because they offer both low capacitance and high ESD performance compared to, for example, ESD diodes and ESD NFETs. An SCR device is a four layer solid-state current-controlling device. The four layer device includes p-n-p-n layers forming a PNPN structure or n-p-n-p layers forming an NPNP structure, either of which have three P-N junctions and three terminals. SCRs are unidirectional devices (i.e., can conduct current only in one direction) and can be triggered normally only by currents going into the gate (as opposed to TRIACs, which can be triggered normally by either a positive or a negative current applied to its gate electrode).

SUMMARY

In an aspect of the disclosure, a structure comprises: a first structure comprising a pattern of a first diffusion region, a second diffusion region and a third diffusion region partly extending over a first well; and a second structure comprising a fourth diffusion region in a second well electrically connecting to the first structure to form a silicon controlled rectifier (SCR) on a bulk region of a substrate.

In an aspect of the disclosure, a structure comprises: a first P+ region of a first structure partly over a first N− region in SOI technology; and a first P− region in bulk substrate with a first N+ region of a second structure formed at an edge of the bulk substrate, adjacent to the semiconductor on insulator (SOI) technology.

In an aspect of the disclosure, a structure comprises: a first fin structure comprising a pattern of alternating diffusion regions extending partly over a first well and a buried oxide layer in a semiconductor on insulator (SOI) region; and a second fin structure composed of a diffusion region and on a second well in a bulk region of a substrate, adjacent to the SOI region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to low capacitance electrostatic discharge (ESD) devices and methods of manufacture. More specifically, the present disclosure relates to low capacitance ESD silicon controlled rectifier (SCR) devices and methods of manufacture. Advantageously, the ESD SCR devices provide a total capacitance reduction for ESD protection, compared to conventional ESD devices. For example, by implementing the ESD SCR structures described herein, it is possible to reduce the C1 capacitance by more than 40% of total Diode-Triggered (DT) SCR capacitance reduction, e.g., C_total reduces from about 0.75 C to 0.43 C. In addition, the ESD SCR structures described herein can have an approximate 30% to 70% reduction on DTSCR total device area.

In embodiments, the ESD SCR devices described herein can be implemented in fin-based technology to improve SCR performance and provide area savings. The ESD SCR are further implemented in hybrid wafers comprising bulk substrates and SOI technologies. For example, a diode-triggered (DT) SCR as described herein can include a fin (stripe) structure with alternating diffusion regions. A first P+ region of the fin structure, a first N-well region, and a first P-well region, with a first N+ region of another fin structure on a bulk region can form an SCR on the bulk region. In embodiments, a second P+ region and N− region can form a first diode on an SOI region, and the first P+ region and N− region of the SCR are segmental and on the edge of bulk and SOI region. The second P+ region of the fin structure and the N− region of the first diode can be segmental and on the SOI region.

The low capacitance ESD SCR devices of the present disclosure can be manufactured in a number of ways using a number of different tools. In general, though, the methodologies and tools are used to form structures with dimensions in the micrometer and nanometer scale. The methodologies, i.e., technologies, employed to manufacture the low capacitance ESD SCR devices of the present disclosure have been adopted from integrated circuit (IC) technology. For example, the structures are built on wafers and are realized in films of material patterned by photolithographic processes on the top of a wafer. In particular, the fabrication of the low capacitance ESD SCR devices uses three basic building blocks: (i) deposition of thin films of material on a substrate, (ii) applying a patterned mask on top of the films by photolithographic imaging, and (iii) etching the films selectively to the mask.

Figure 1:
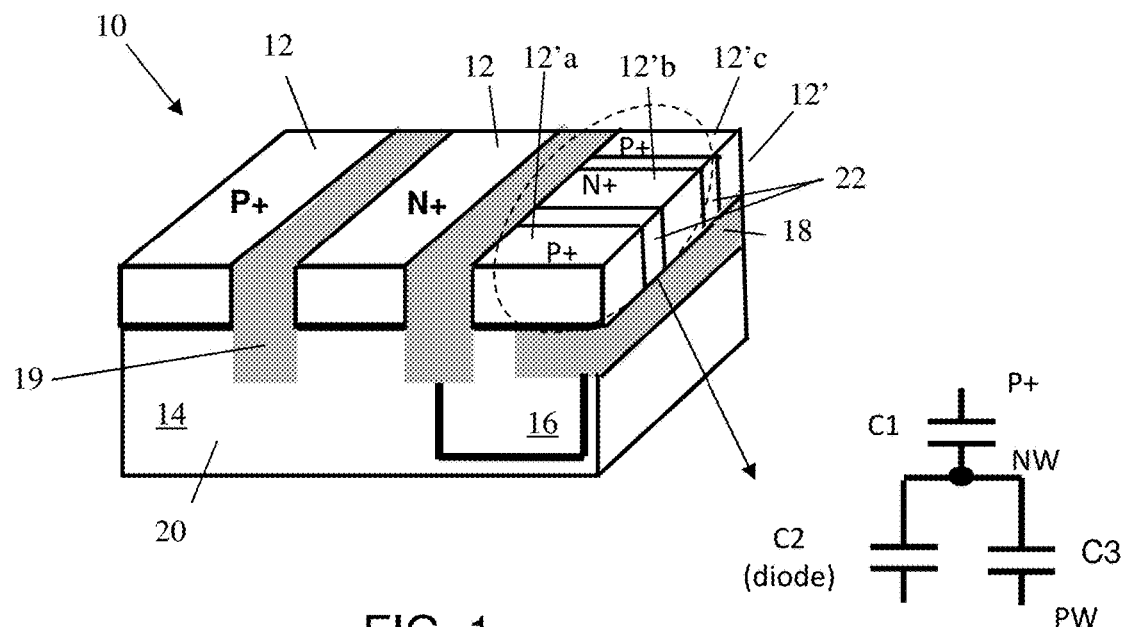
FIG. 1 shows an ESD SCR structure and respective fabrication processes in accordance with aspects of the present disclosure.

FIG. 1 shows an ESD SCR structure and respective fabrication processes in accordance with aspects of the present disclosure. In embodiments, the structure 10 includes a plurality of fin structures (also referred to as stripes) 12 formed over a P-well 14 in a bulk substrate 20 and a fin structure 12' formed over an N-well 16 and at least partially over a buried oxide layer (BOX) layer 18 of SOI technology (in an SOI region). In embodiments, the BOX layer 18 will partially isolate the fin structure 12' from the N-well 16 to reduce the capacitance between the P+ region of the fin structure 12' and the N-well 14.

In more specific embodiments, the fin structure 12' is formed from fully depleted SOI material, and partly (e.g., ½) on the BOX layer 18 to reduce the capacitance between the P+ region of the fin structure 12' and the N-well 14 by approximately one half (½). The fin structures 12, 12' can be electrically separated from one another by an insulator material 19, which can be partially formed in the P-well 14 and the N-well 16.

In embodiments, the bulk substrate material 20 may be composed of any suitable semiconductor material including, but not limited to, Si, SiGe, SiGeC, SiC, GaAs, InAs, InP, and other III/V or II/VI compound semiconductors. The fin structure 12' can also be formed from a fully depleted SOI in an SOI region. Also, the P-well 14 and the N-well 16 can be formed by any conventional ion implantation or doping processes known to those of skill in the art such that no further explanation is required for an understanding of the present disclosure. For example, the P-well 14 and the N-well 16 can be doped or ion implanted using, e.g., boron, arsenic or phosphorous (with masking or blocking materials) at a conventional energy level, e.g., 1e20.

The insulator material 19 can be any insulator material, e.g., oxide based material or nitride based material, formed using conventional CMOS processes. For example, the insulator material 19 can be shallow trench isolation regions, formed partially within the bulk substrate material 20 and raised between the fin structures 12, 12'. The etching process to form an initial trench can be a reactive ion etching (RIE) with selective chemistries to form a trench in the substrate material 20. The deposition process can be any conventional deposition process such as, e.g., chemical vapor deposition (CVD) processes, which deposits material within the trenches and raised above the trenches, between the fin structures 12, 12'. After deposition of the insulator material 19, any residual material can be removed by a conventional chemical vapor deposition process.

The fin structures 12, 12' can be fabricated using any conventional CMOS process including a sidewall image transfer (SIT) technique. In an example of a SIT technique, a mandrel material, e.g., $SiO_2$, is deposited on the bulk substrate material 20 (and semiconductor material of the SOI technology) using conventional CVD processes. A resist is formed on the mandrel material, and exposed to light to form a pattern (openings). A reactive ion etching is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures 12, 12', for example. The mandrels are removed or stripped using a conventional etching process, selective to the mandrel material. An etching is then performed within the spacing of the spacers to form the sub-lithographic features. The sidewall spacers can then be stripped.

In embodiments, the fin structures 12 are a P+ fin structure alternating with an N+ fin structure, with the N+ fin structure at the edge of the bulk substrate material 20 and SOI regions, in embodiments. The P+ and N+ fin structures 12 can be fabricated using any conventional ion implantation or dopant techniques known to those of ordinary skill in the art such that further explanation is not required for an understanding of the present disclosure, e.g., using boron, arsenic or phosphorous (with masking or blocking materials) at a conventional energy level, e.g., 1e20. In embodiments, on the other hand, the fin structure 12' is provided at the edge of the SOI technology and the bulk substrate 20 and comprises an alternating pattern of P+ diffusion material 12'a, N+ diffusion material 12'b and P+ diffusion material 12'c, separated by insulator material 22 and partially formed over the bulk substrate material 20 and the BOX layer 18 of the SOI technology. The fin structure 12', N+ fin structure and the wells (e.g., P-well 14 and N-well 16 under the BOX)) will form a four layer SCR device, e.g., PNPN, over the bulk substrate material 20.

In embodiments, the P+ diffusion material 12'a, 12'c can be fabricated using any conventional ion implantation or dopant techniques, preferably while forming the P+ fin structure 12; whereas, the N+ diffusion material 12'b can be fabricated using any conventional ion implantation or dopant technique, preferably while forming the N+ fin structure 12. As should be understood by those of skill in the art, a blocking material (not shown) will be used to block N+ diffusion material from diffusing into the P+ regions and vice versa during these processes. In embodiments, the insulator material 22 can also be deposited separately or in the same processing steps of forming the insulator material 18.

In embodiments, the P+ diffusion material 12'a will electrically connect to the N+ fin structure 12 through the P-well 14 and the N-well 16, forming a PNPN SCR device on the bulk substrate 20. This compact structure (using a single fin with a PNP arrangement) will save significant space while also improving the capacitance of the ESD device, compared to conventional structures. For example, the capacitance C1 (e.g., capacitance between the P+ diffusion material 12'a of the fin structure 12 and the N-well 16) will be lower than conventional SCR devices or other ESD structures, hence reducing the total capacitance of the SCR device. In addition, the P+ fin and N+ structures 12 with the P+ diffusion material 12'a will form a diode structure over the bulk region of the structure.

Figure 2A:
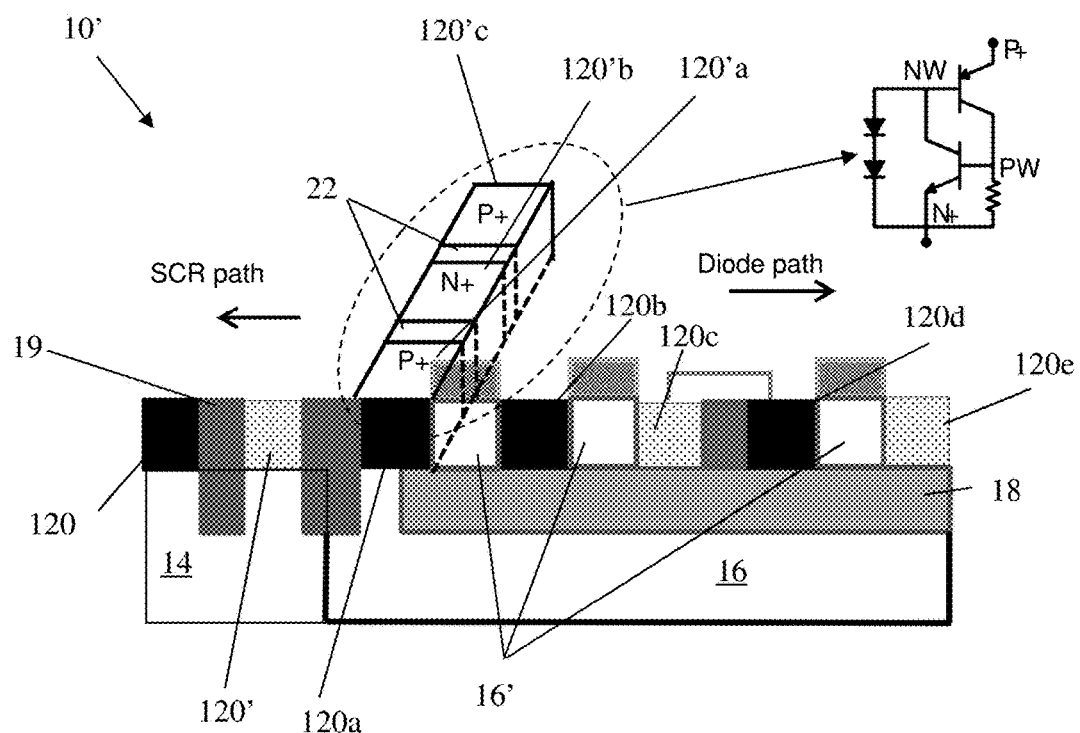
FIG. 2A shows an ESD SCR structure and respective fabrication processes in accordance with additional aspects of the present disclosure.
Figure 2B:
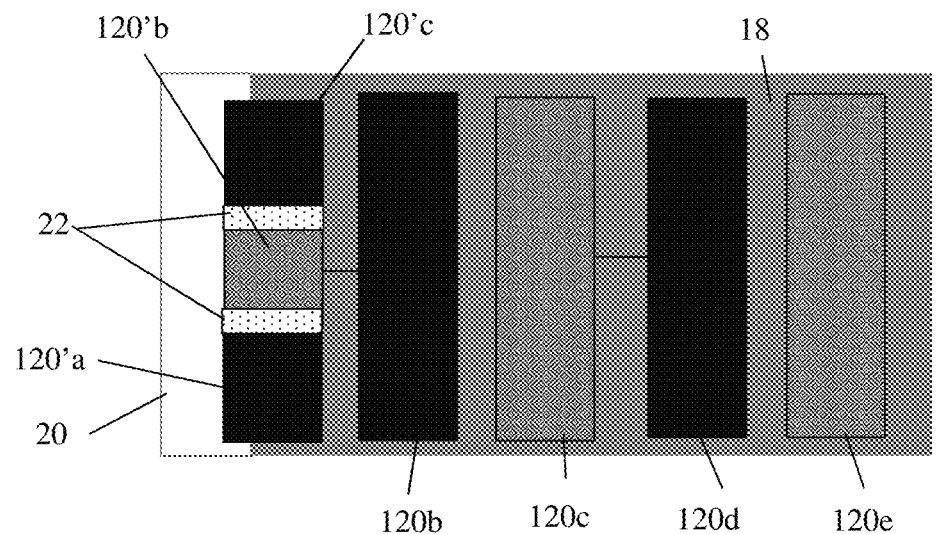
FIG. 2B shows a partial top view of the ESD SCR structure of FIG. 2A.

FIG. 2A shows an ESD SCR structure and respective fabrication processes in accordance with additional aspects of the present disclosure. FIG. 2B shows a partial top view of the ESD SCR structure of FIG. 2A. In embodiments, the structure 10' includes a plurality of fin structures 120, 120' formed over a P-well 14 in the bulk substrate 20 as described with respect to FIG. 1. As shown in FIG. 2A, the fin structure 120' is provided at the edge of the bulk substrate 20. A plurality of fin structures 120a, 120b, 120c, 120d, 120e are formed over a BOX layer 18 and in an N-well 16 of SOI technology. In embodiments, the fin structures 120a, 120b, 120c, 120d, 120e can be formed in fully depleted semiconductor material of SOI technology. As described further herein, the fin structures and wells (P-well 14 and N-well 16) form an SCR device in the bulk substrate 20, and remaining fin structures on the BOX layer 18 can form diodes in SOI technology.

Similar to that described with respect to FIG. 1, the fin structure 120a can be partially formed over the bulk substrate material 20 and the BOX layer 18 of the SOI technology. In embodiments, the remaining fin structures 120b, 120c, 120d, 120e are formed over the BOX layer 18, with the N-well 16' (second diffusion) between (i) the fin structures 120a and 120b; (ii) 120b and 120c; and (iii) 120d and 120e. And, as should be understood by those of skill in the art, an insulator material 19 will electrically isolate (i) the fin structures 120 and 120', (ii) the fin structures 120' and 120a and (iii) the fin structures 120c and 120d.

In embodiments, the fin structures 120, 120*b* and 120*d* are P+ fin structures; whereas, the fin structures 120', 120*c* and 120*e* are N+ fin structures formed in the manner described herein. Also, similar to that described above, the fin structure 120*a* comprises an alternating pattern of P+ diffusion material 120'*a*, N+ diffusion material 120'*b* and P+ diffusion material 120'*c*, separated by insulator material 22. In this way, the P+ diffusion material 120'*a*, the N+ fin structure 120' and the wells will form a compact PNPN SCR device (e.g., SCR path) in the bulk substrate 20. Also, the N+ diffusion material 120'*b* of the fin structure 120*a* and the fin structure 120*b* are electrically connected to form a first diode in the SOI technology, whereas, the fin structures 120*c* and 120*d* are electrically connected to form a second diode in the SOI technology.

Figure 3:
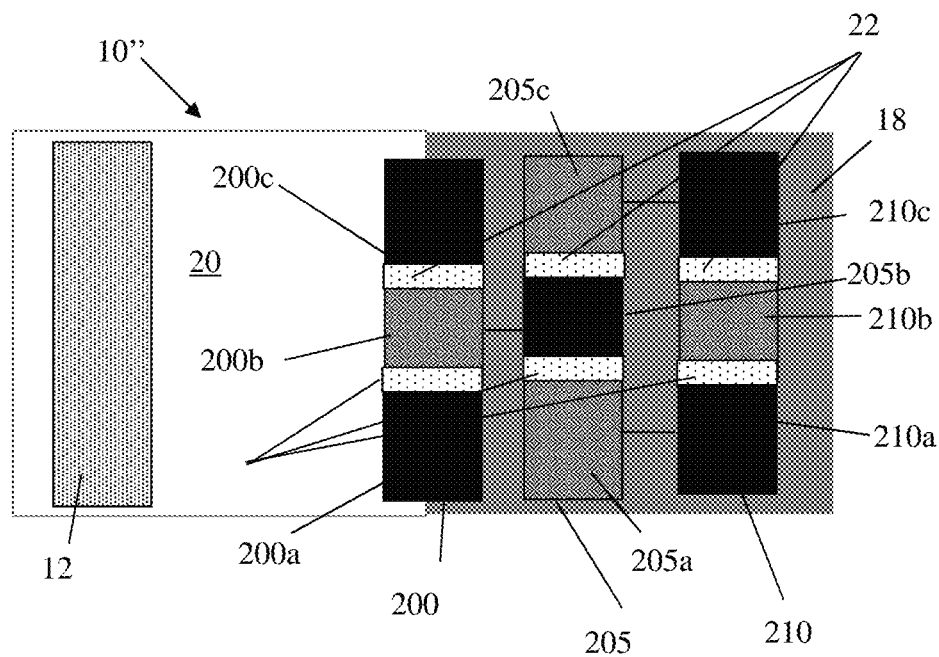
FIG. 3 shows an ESD SCR structure and respective fabrication processes in accordance with an additional aspect of the present disclosure.

FIG. 3 shows an ESD SCR structure and respective fabrication processes in accordance with additional aspects of the present disclosure. In embodiments, the structure 10" includes a plurality of fin structures 200, 205 and 210, with the fin structure 200 formed at an edge of the P-well 14 in a bulk substrate 20. The fin structures 205 and 210 are formed over the BOX layer 18 in an N-well 16 of SOI technology similar that as described with respect to FIG. 1. Accordingly, the fin structure 200 formed at an edge of the bulk substrate 20 and SOI technology can be used form an SCR device (with the wells).

As described herein, the fin structure 200 comprises an alternating pattern of P+ diffusion material 200*a*, N+ diffusion material 200*b* and P+ diffusion material 200*c*, separated by insulator material 22. The fin structure 200, wells and fin structure 12 in the bulk substrate 20 will form a compact SCR device over the bulk substrate material 20. And, as described herein, the fin structure 200 partly formed over the BOX layer 18 will significantly reduce the capacitance of the SCR device, compared to conventional structures.

Still referring to FIG. 3, the fin structure 205 comprises an alternating pattern of N+ diffusion material 205*a*, P+ diffusion material 205*b* and N+ diffusion material 205*c*, separated by insulator material 22, to form a first diode (completely isolated from the N-well). The fin structure 210 comprises an alternating pattern of P+ diffusion material 210*a*, N+ diffusion material 210*b* and P+ diffusion material 210*c*, separated by insulator material 22, to form a second diode (completely isolated from the N-well). In this way, two compact diodes can be fabricated. Also, in embodiments, the N+ diffusion material 200*b* of the fin structure 200 is electrically connected to the P+ diffusion material 205*b* of the fin structure 205, whereas, the N+ diffusion material 205*a*, 205*c* of the fin structure 205 is electrically connected to the P+ diffusion material 210*a*, 210*c* of the fin structure 210.

Figure 4:
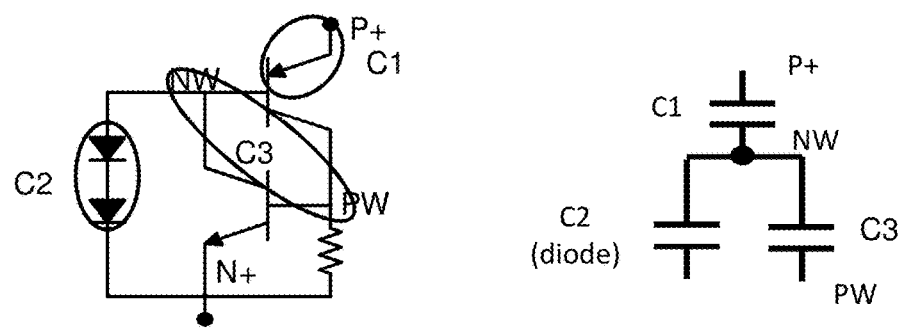
FIG. 4 shows a comparison of estimated capacitance for an ESD SCR device in accordance with aspects of the present disclosure and a conventional ESD device.

FIG. 4 shows a comparison of estimated capacitance for an ESD device in accordance with aspects of the present disclosure and a conventional ESD device. As shown in this comparison, the C1 capacitance of a structure in accordance with the present disclosure can have a reduction in C1 capacitance in more than 40% of the total DTSCR capacitance reduction, e.g., C_total reduces from 0.75 to 0.43.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first structure comprising a pattern of a first diffusion region, a second diffusion region and a third diffusion region partly extending over a first well; and
   a second structure comprising a fourth diffusion region in a second well electrically connecting to the first structure to form a silicon controlled rectifier (SCR) on a bulk region of a substrate.

2. The structure of claim 1, wherein the first structure is a first fin structure partly over a buried oxide layer and the first well, and the second structure is a second fin structure over the second well in a bulk substrate.

3. The structure of claim 2, wherein the first diffusion region is a P+ diffusion region, the first well is an N-well region, the second well is a P-well region and the fourth diffusion is an N+ region, forming a PNPN SCR.

4. The structure of claim 3, wherein the second fin structure is formed at an edge of a bulk substrate material and the first fin structure is formed of semiconductor on insulator (SOI) material.

5. The structure of claim 4, wherein the SOI material is fully depleted SOI material.

6. The structure of claim 1, wherein:
   the first structure is a fin structure;
   the first diffusion region is P+ diffusion material;
   the second diffusion region is N+ diffusion material; and
   the third diffusion region is P+ diffusion material.

7. The structure of claim 1, further comprising a first diode comprising the first diffusion region and a second well.

8. The structure of claim 7, further comprising a second diode comprising a second fin structure and the second well.

9. The structure of claim 8, wherein the first diode and the second diode are formed over a buried oxide layer of an SOI region.

10. The structure of claim 1, further comprising a first diode comprising a fin structure of alternating diffusion regions.

11. The structure of claim 10, wherein the first diode is provided in an SOI region, isolated from a well structure by a buried oxide layer.

12. A structure comprising:
   a first P+ region of a first structure partly over a first N− region in semiconductor on insulator (SOI) technology; and a first P− region in a bulk substrate with a first N+ region of a second structure formed at an edge of the bulk substrate, adjacent to the SOI technology.

13. The structure of claim 12, wherein the first P+ region is partly formed on a buried oxide layer of the SOI technology.

14. The structure of claim 12, wherein the first P+ region is formed from fully depleted semiconductor material of the SOI technology.

15. The structure of claim 13, wherein the first structure is a first fin structure and the second structure is a second fin structure.

16. The structure of claim 13, further comprising a first diode comprising a second P+ region and a second N-region over the buried oxide layer in an SOI region.

17. The structure of claim 16, wherein the first P+ region and the first N− region are segmented and at an edge of the bulk technology and the SOI region.

18. The structure of claim 17, wherein the second P+ region and the second N− region are on an SOI region.

19. A structure, comprising:
a first fin structure comprising a pattern of alternating diffusion regions extending partly over a first well and a buried oxide layer in a semiconductor on insulator (SOI) region; and
a second fin structure composed of a diffusion region and on a second well in a bulk region of a substrate, adjacent to the SOI region.

20. The structure of claim 19, wherein the first fin structure includes a P+ region, the first well is an N-well, the second well is a P-well and the diffusion region of the second fin structure is an N-diffusion, forming a PNPN silicon controlled rectifier (SCR).

* * * * *